(12) United States Patent
Fu et al.

(10) Patent No.: US 10,418,728 B2
(45) Date of Patent: Sep. 17, 2019

(54) CONNECTOR

(71) Applicant: Tyco Electronics (Shanghai) Co. Ltd., Shanghai (CN)

(72) Inventors: Xiaozhi Fu, Shanghai (CN); Ming Shi, Shanghai (CN); Xiang Xu, Shanghai (CN); Wei Zhang, Shanghai (CN); Cui Li, Shanghai (CN)

(73) Assignee: Tyco Electronics (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 16/026,700

(22) Filed: Jul. 3, 2018

(65) Prior Publication Data

US 2019/0013599 A1    Jan. 10, 2019

(30) Foreign Application Priority Data

Jul. 5, 2017  (CN) .................... 2017 2 0804698 U

(51) Int. Cl.
| | |
|---|---|
| *H01R 4/50* | (2006.01) |
| *H01R 4/48* | (2006.01) |
| *H01R 12/51* | (2011.01) |
| *H01R 12/71* | (2011.01) |
| *H01R 13/42* | (2006.01) |
| *H05K 3/32* | (2006.01) |
| *H01R 12/57* | (2011.01) |
| *H01R 12/58* | (2011.01) |
| *H01R 101/00* | (2006.01) |

(52) U.S. Cl.
CPC ......... *H01R 4/5083* (2013.01); *H01R 4/4836* (2013.01); *H01R 4/4845* (2013.01); *H01R 4/5033* (2013.01); *H01R 12/515* (2013.01); *H01R 12/718* (2013.01); *H01R 13/42* (2013.01); *H05K 3/32* (2013.01); *H01R 12/57* (2013.01); *H01R 12/58* (2013.01); *H01R 2101/00* (2013.01)

(58) Field of Classification Search
CPC .. H01R 4/5083; H01R 12/79; H01R 12/7082; H01R 12/721; H01R 4/4845; H01R 4/4836; H01R 4/5033; H05K 3/32
USPC ......................................................... 439/783
See application file for complete search history.

(56) References Cited

U.S. PATENT DOCUMENTS

| | | | | |
|---|---|---|---|---|
| 5,967,831 | A | * | 10/1999 | Yamada ................. H01R 12/79 439/108 |
| 6,089,925 | A | * | 7/2000 | Maltais ................ H01R 12/721 439/686 |
| 7,182,299 | B2 | * | 2/2007 | Takeuchi ............... F16B 5/0685 24/16 PB |

(Continued)

*Primary Examiner* — Jean F Duverne
(74) *Attorney, Agent, or Firm* — Barley Snyder

(57) ABSTRACT

A connector having a contact made of metal, and comprises a pair of elastic arms adapted to clamp a conductor of a wire, so as to electrically contact the conductor. A first release structure is on one of the pair of elastic arms and a second release structure, facing the first release structure, is on the other of the pair of elastic arms. A wedge channel is defined between the first release structure and the second release structure when the conductor is clamped between the pair of elastic arms and the wedge channel gradually widens toward free ends of the pair of elastic arms. The pair of elastic arms are adapted to be expanded away from each other by inserting an external tool into the wedge channel, so as to release the clamped conductor, improving the use convenience of the connector.

17 Claims, 4 Drawing Sheets

(56) References Cited

U.S. PATENT DOCUMENTS

| | | | |
|---|---|---|---|
| 7,523,898 B1* | 4/2009 | Barry .................... | F16B 5/0685 |
| | | | 174/164 |
| 8,550,854 B2* | 10/2013 | Okano ............... | H01R 12/7082 |
| | | | 439/631 |
| 9,397,444 B1* | 7/2016 | Wu ....................... | H01R 4/4845 |
| 2016/0190713 A1* | 6/2016 | Wu ...................... | H01R 4/4836 |
| | | | 439/733.1 |

* cited by examiner

CONNECTOR

CROSS-REFERENCE TO RELATED APPLICATIONS

This application claims the benefit of the filing date under 35 U.S.C. § 119(a)-(d) of Chinese Patent Application No. 201720804698.1 filed on Jul. 5, 2017.

FIELD OF THE INVENTION

The present invention relates, in general, to connectors and, in particular, to a connector adapted to claim a wire.

BACKGROUND

In the related art, a connector generally comprises an insulation body and a contact received in the insulation body. It is necessary to hold the contact in the insulation body, otherwise the contact cannot work properly.

In order to simplify the structure of the connector and reduce the cost of the connector, in the related art, there is provided a connector consisting of only a contact, that is, the connector includes only a contact made of metal. Typically, the contact comprises a soldering portion that may be directly welded onto a circuit board and a clamping portion that may clamp a conductor of a wire.

However, in the related art, a clamping force exerted on the conductor by the contact of the connector is too small to reliably hold the conductor of the wire, which causes the conductor of the wire to easily detach from the contact. In order to prevent a conductor of the wire from being detached from the contact, in the related art, it is sometimes necessary to solder the conductor of wire to the contact, which causes the contact to be used only once and not to be reused.

SUMMARY

In accordance with the present invention, a connector comprises a contact made of metal and has a pair of elastic arms that clamp a conductor of a wire to bring the contact into electrical contact with the conductor. The contact has a first elastic arm having a first release structure and a second elastic arm having a second release structure facing the first release structure and defining with the first release structure a wedge channel that gradually widens toward the free ends of the first elastic arm and the second elastic arm when the conductor is clamped between the first elastic arm and the second elastic arm. The pair of elastic arms are adapted to be expanded away from each other by inserting an external tool into the wedge channel, so as to release the clamped conductor.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENT(S)

Figure 1:
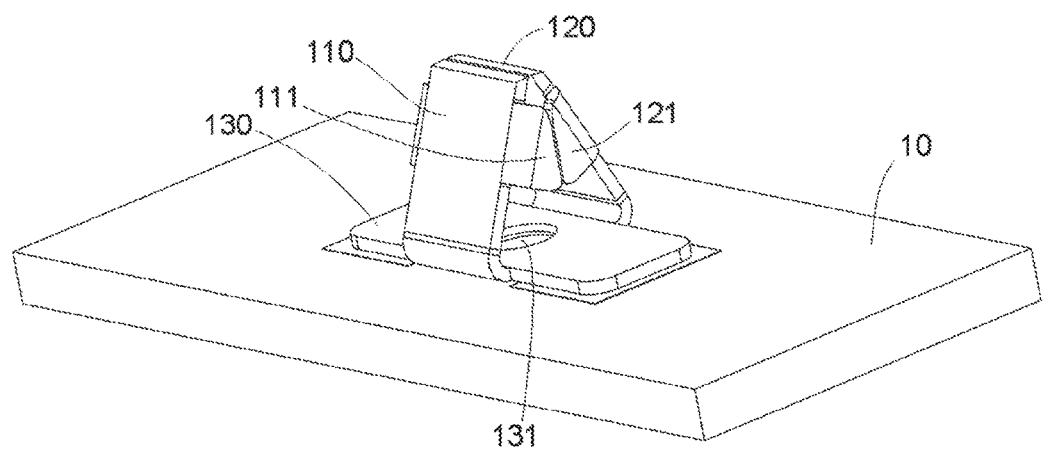
FIG. 1 is an illustrative perspective view of a connector according to an embodiment of the present invention.

Exemplary embodiments of the present invention will be described hereinafter in detail with reference to the attached drawings, wherein the like reference numerals refer to the like elements. The present invention may, however, be embodied in many different forms and should not be construed as being limited to the embodiment set forth herein; rather, these embodiments of the present invention are provided so that the disclosure of the present invention will be thorough and complete and will fully convey the concept of the present invention to those skilled in the art.

In the following detailed description, for purposes of explanation, numerous specific details are set forth in order to provide a thorough understanding of the disclosed embodiments of the present invention. It will be apparent, however, that one or more embodiments may be practiced without these specific details. In other instances, well-known structures and devices are schematically shown in order to simplify the drawing.

Figure 2:
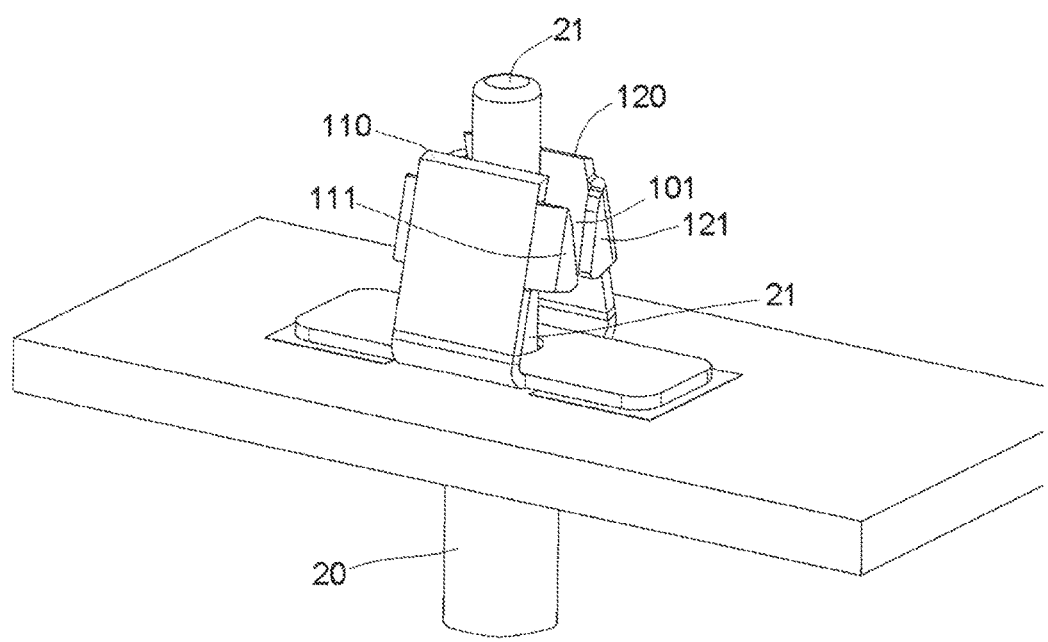
FIG. 2 shows a view in which a conductor of a wire is inserted between a pair of elastic arms of a contact of the connector of FIG. 1.
Figure 3:
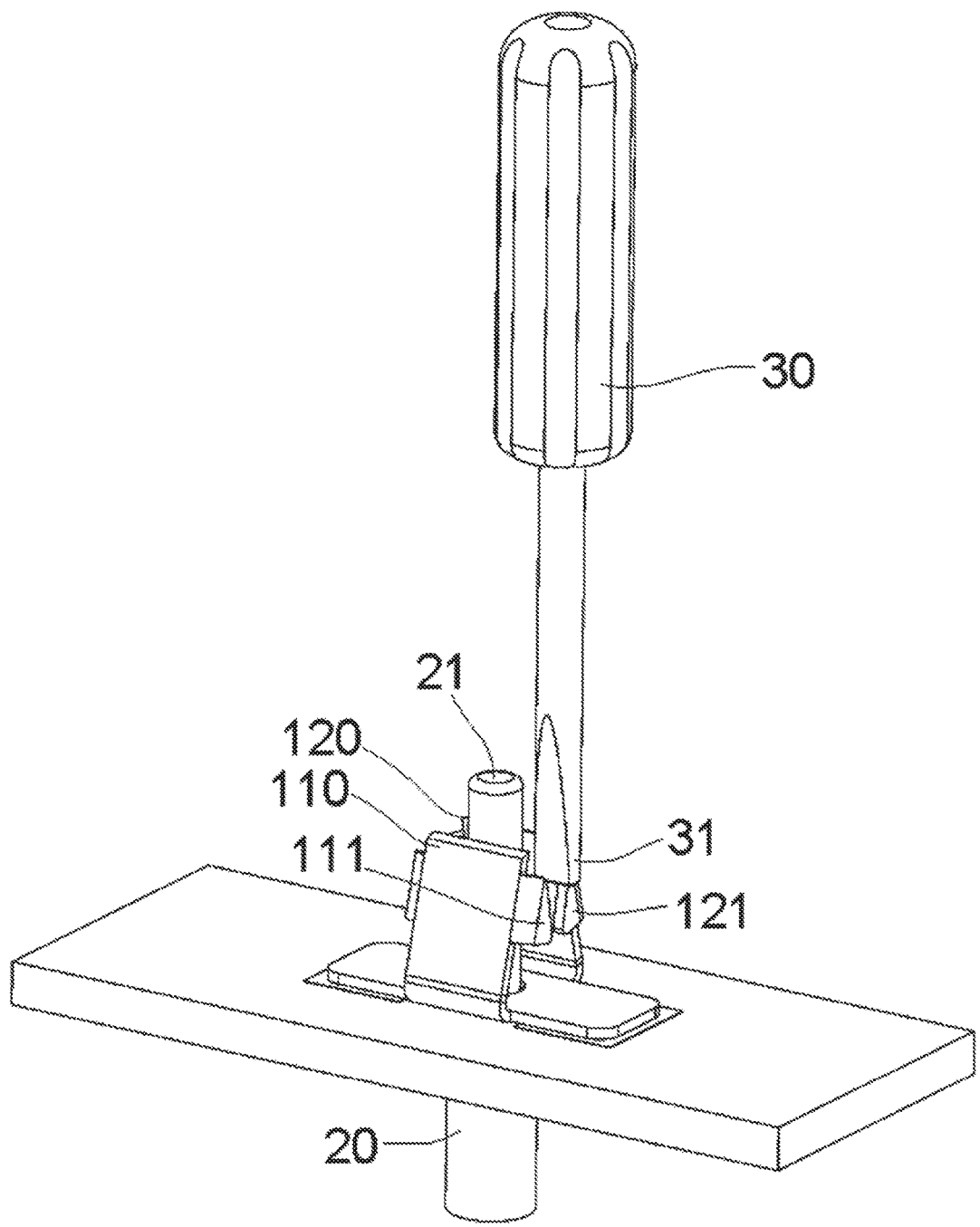
FIG. 3 shows a view in which the conductor is released from the contact of FIG. 2 by an external tool.

As shown in FIGS. 1-3, the connector has only one contact made of metal. The contact comprises a pair of elastic arms 110, 120 adapted to clamp a conductor 21 of a wire 20, so as to bring them into electrical contact with the conductor 21. In order to reliably clamp the conductor 21 and reliably electrically contact the conductor 21, the pair of elastic arms 110, 120 each has a larger width and a larger thickness to increase a clamping force to clamp the conductor 21 of the wire 20.

As shown in FIGS. 1-3, a first release structure 111 is formed on one of the pair of elastic arms 110, 120. A second release structure 121 facing the first release structure 111 is formed on the other of the pair of elastic arms 110, 120.

As clearly shown in FIG. 2, a wedge channel 101 is defined between the first release structure 111 and the second release structure 121 when the conductor 21 is clamped between the pair of elastic arms 110, 120.

As shown in FIGS. 2-3, the wedge channel 101 is gradually widened toward free ends (top ends in FIGS. 2-3) of the pair of elastic arms 110, 120. Thereby, the pair of elastic arms 110, 120 are adapted to be expanded far away from each other by inserting an external tool 30 into the wedge channel 101, so as to release the clamped conductor 21.

As shown in FIG. 3, the external tool 30 may be a screwdriver. A top end 31 of the screwdriver may be inserted downwardly into the wedge channel 101. In this way, the pair of elastic arms 110, 120 may be expanded far away from each other by the external tool 30 and the clamped conductor 21 may be easily released from the pair of elastic arms 110, 120.

As shown in FIGS. 1-3, the first release structure 111 is formed on a side edge of each side of one elastic arm 110 of the pair of elastic arms 110, 120. The second release structure 121 is formed on a side edge of each side of the other elastic arm 120 of the pair of elastic arms 110, 120.

As shown in FIGS. 1-3, the first release structure 111 and the second release structure 121 each is configured as a triangular plate-shaped component.

As shown in FIGS. 1-3, the contact further comprises a soldering part 130 connected to the pair of elastic arms 110, 120 and adapted to be soldered on one surface (top surface in FIGS. 1-3) of a circuit board 10.

As shown in FIGS. 1-3, the soldering part 130 is flat-shaped with, a through hole 131 in the soldering part 130 and a conductor 21 of the wire 20 is adapted to be inserted between the pair of elastic arms 110, 120 through the through hole 131 of the soldering part 130.

As shown in FIGS. 1-3, when the contact is soldered on the one surface of the circuit board 10, the whole contact is located above the one surface of the circuit board 10.

Hereinafter, another embodiment of the present invention will be described in detail with reference to FIGS. 4-6.

Figure 4:
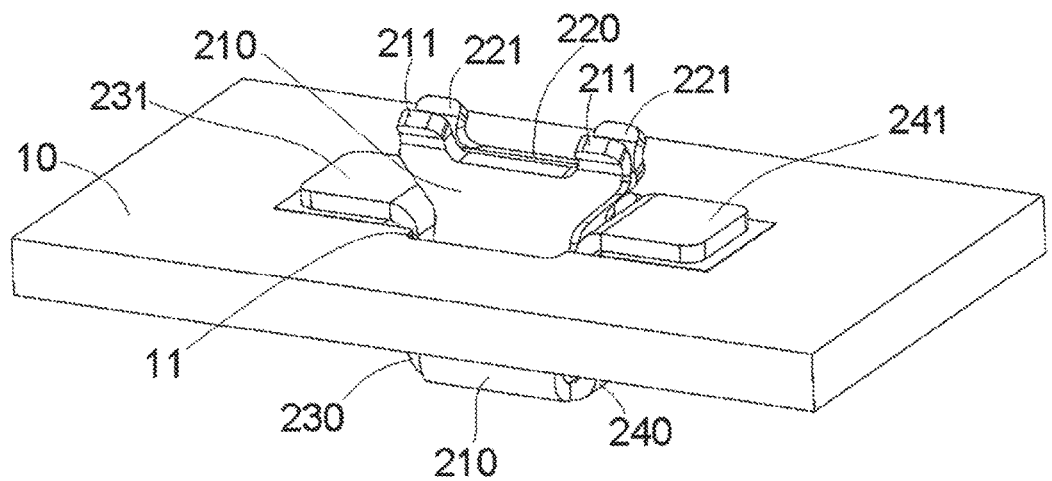
FIG. 4 is an illustrative perspective view of a connector according to another embodiment of the present invention.
Figure 5:
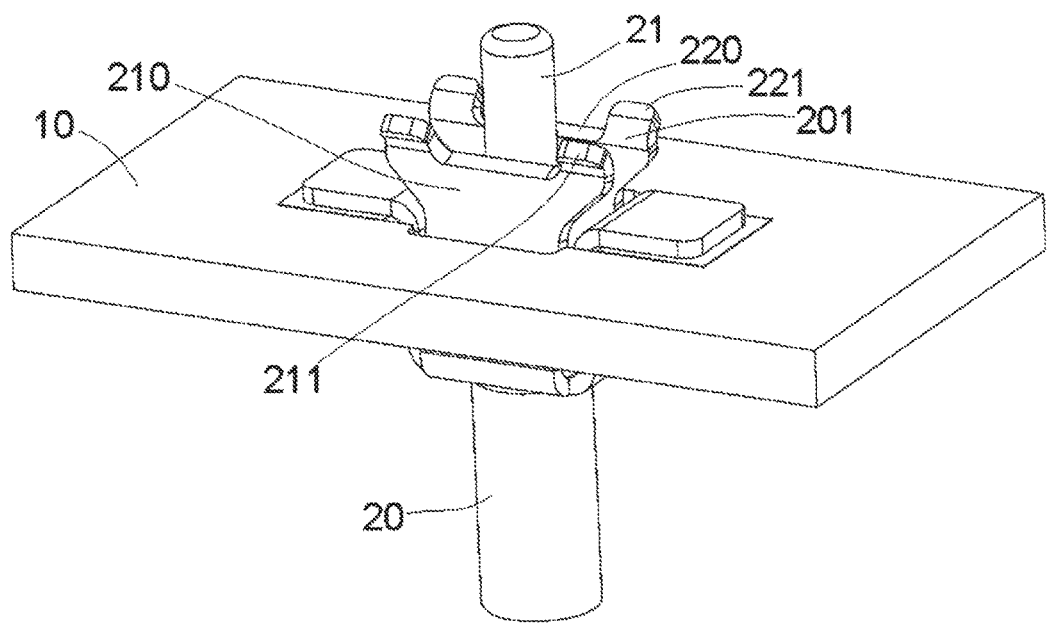
FIG. 5 shows a view in which a conductor of a wire is inserted between a pair of elastic arms of a contact of the connector of FIG. 4.
Figure 6:
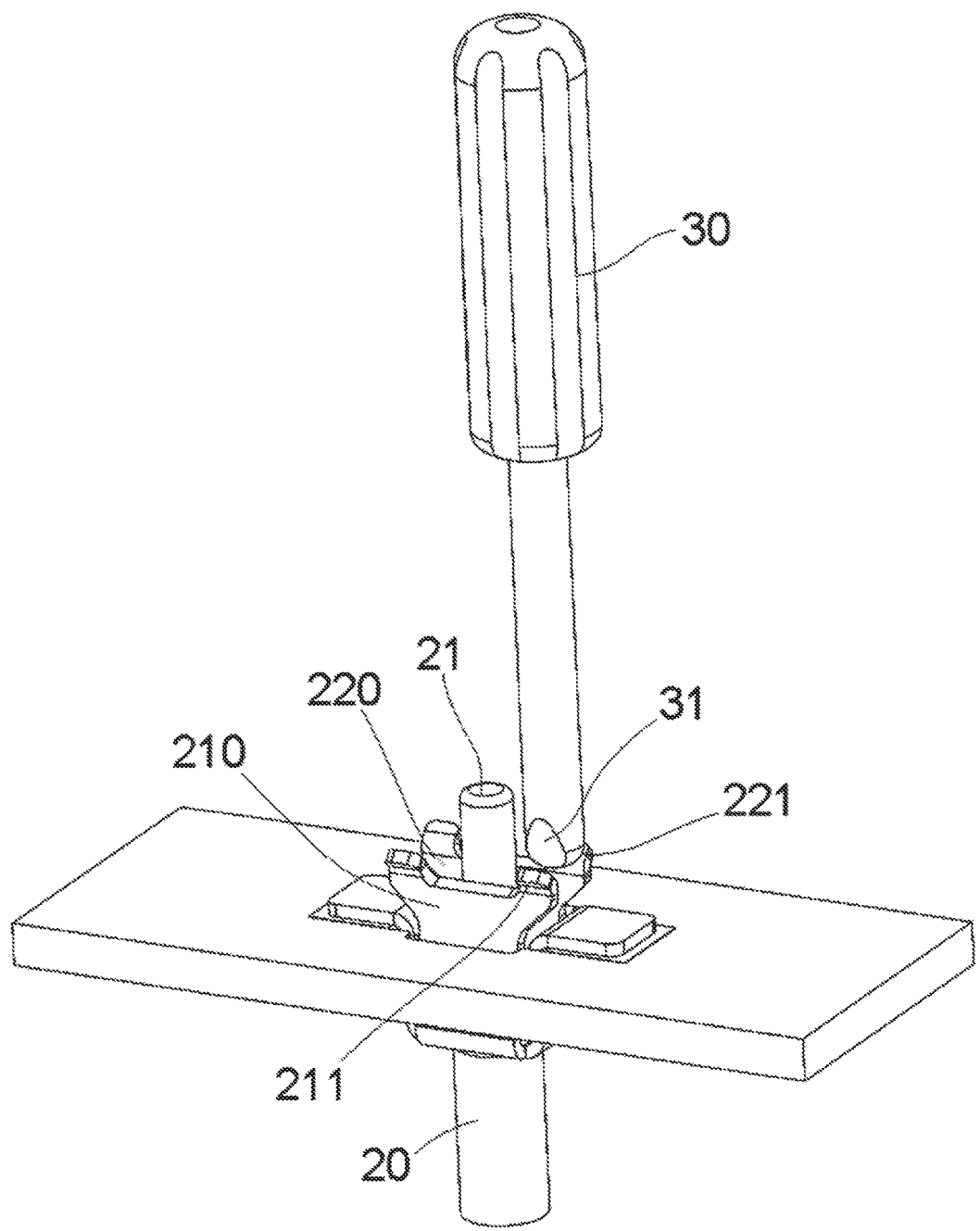
FIG. 6 shows a view in which the conductor is released from the contact of FIG. 5 by an external tool.

As shown in FIGS. 4-6, the connector consists of only one contact made of metal. The contact has a pair of elastic arms 210, 220 adapted to clamp a conductor 21 of a wire 20, so as to bring them into electrical contact with the conductor 21. In order to reliably clamp the conductor 21 and reliably electrically contact the conductor 21, each of the pair of elastic arms 210, 220 has a larger width and a larger thickness to increase a clamping force to clamp the conductor 21 of the wire 20.

As shown in FIGS. 4-6, a first release structure 211 is formed on one of the elastic arms 210, 220. A second release structure 221 facing the first release structure 211 is formed on the other of the pair of elastic arms 210, 220.

As clearly shown in FIG. 5, a wedge channel 201 is defined between the first release structure 211 and the second release structure 221 when the conductor 21 is clamped between the pair of elastic arms 210, 220.

As shown in FIGS. 5-6, the wedge channel 201 is gradually widened toward free ends (top ends in FIGS. 5-6) of the pair of elastic arms 210, 220. Thereby, the pair of elastic arms 210, 220 are expanded far away from each other by inserting an external tool 30 into the wedge channel 201, so as to release the clamped conductor 21.

As shown in FIG. 6, the external tool 30 may comprise a screwdriver. A top end 31 of the screwdriver may be inserted downwardly into the wedge channel 201. In this way, the pair of elastic arms 210, 220 may be expanded far away from each other by the external tool 30, and the clamped conductor 21 may be easily released from the pair of elastic arms 210, 220.

As shown in FIGS. 4-6, the first release structure 211 is formed on a top edge of each side of one elastic arm 210 of the pair of elastic arms 210, 220. The second release structure 221 is formed on a top edge of each side of the other elastic arm 220 of the pair of elastic arms 210, 220.

As shown in FIGS. 4-6, the first release structure 211 and the second release structure 221 each is configured as an arc finger component.

As shown in FIGS. 4-6, the contact further ha a pair of connection arms 230, 240 located at both sides of the pair of elastic arms 210, 220. One end of each of the pair of connection arms 230, 240 is connected to one of the pair of elastic arms 210, 220. The other end of each of the pair of connection arms 230, 240 is formed with a soldering part 231, 241 adapted to be soldered on one surface (top surface) of a circuit board 10.

As shown in FIGS. 4-6, when the contact is soldered on the one surface of the circuit board 10, the pair of elastic arms 210, 220 and the pair of connection arms 230, 240 pass through the circuit board 10 and protrude from the other surface (bottom surface) of the circuit board 10 opposite to the one surface.

As shown in FIGS. 4-6, when the contact is soldered on the one surface of the circuit board 10, the top ends (free ends) of the pair of elastic arms 210, 220 for clamping the conductor 21 are located above the one surface of the circuit board 10.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the present invention, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

What is claimed is:

1. A connector comprising a contact made of metal and having a pair of elastic arms that clamp a conductor of a wire to bring the contact into electrical contact with the conductor, the contact having:
   a first elastic arm having a first release structure;
   a second elastic arm having a second release structure facing the first release structure and defining with the first release structure a wedge channel that gradually widens toward the free ends of the first elastic arm and the second elastic arm when the conductor is clamped between the first elastic arm and the second elastic arm; and
   a pair of connection arms at both sides of the first elastic arm and the second elastic arm, one end of each of the pair of connection arms is connected to one of the elastic arms, and the other end of each of the pair of connection arms has a soldering part adapted to be soldered on one surface of a circuit board, and the contact is soldered on the one surface of the circuit board, the first elastic arm and the second elastic arm and the pair of connection arms pass through the circuit board and protrude from the other surface of the circuit board opposite to the one surface.

2. The connector according to claim 1, wherein the first release structure is formed on a side edge of each side of the first elastic arm and the second release structure is formed on a side edge of each side of the second elastic arm.

3. The connector according to claim 2, wherein each of the first release structure and the second release structure is a triangular plate-shaped component.

4. The connector according to claim 1, wherein the soldering part is flat with a through hole and a conductor of the wire is inserted between the first elastic arm and the second elastic arm through the through hole of the soldering part.

5. The connector according to claim 4, wherein when the contact is soldered on the one surface of the circuit board and the whole contact is located above the one surface of the circuit board.

6. The connector according to claim 1, wherein the first release structure is on a top edge of each side of the first elastic arm and the second release structure is on a top edge of each side of the second elastic arm.

7. The connector according to claim 6, wherein each of the first release structure and the second release structure is an arc finger component.

8. The connector according to claim 1, wherein, when the contact is soldered on the one surface of the circuit board, the free ends of the first elastic arm and the second elastic arm are located above the one surface of the circuit board.

9. A metal electrical contact comprising:
- a pair of elastic arms that clamp and electrically connect to a conductor;
- each elastic arm having a respective release structure;
- the respective release structures facing each other and defining a wedge channel there between that gradually widens toward free ends of the elastic arms;
- the conductor being releasable by an external tool inserted into the wedge channel expanding the elastic arms away from each other.

10. The connector according to claim 9, wherein the respective release structures each project from a side edge of each side of the pair of elastic arms.

11. The connector according to claim 10, wherein each of the respective release structures is a triangular plate-shaped component.

12. The connector according to claim 9, wherein each elastic arm and each respective release structure are arranged perpendicular to one another.

13. The connector according to claim 9, wherein the contact further includes a soldering part connected to each one of the pair of elastic arms and is adapted to be soldered on a surface of a circuit board.

14. The connector according to claim 13, wherein the soldering part is flat with a through hole and a conductor of the wire is inserted between the elastic arms through the through hole of the soldering part.

15. The connector according to claim 14, wherein when the contact is soldered on the surface of the circuit board and the whole contact is located above the surface.

16. The connector according to claim 9, wherein one of the respective release structures is on a top edge of each side of one of the pair of elastic arms and another of the respective release structures is on a top edge of each side of another of the pair of elastic arms.

17. The connector according to claim 16, wherein each of the respective release structures is an arc finger component.

* * * * *